United States Patent [19]

Drabek et al.

[11] Patent Number: 5,403,978
[45] Date of Patent: Apr. 4, 1995

[54] TWO-LAYER OR MULTILAYER PRINTED CIRCUIT BOARD

[75] Inventors: Rudolf Drabek, Vienna; Werner Uggowitzer, Ferlach, both of Austria

[73] Assignee: U.S. Philips Corporation, New York, N.Y.

[21] Appl. No.: 966,773

[22] Filed: Oct. 27, 1992

[30] Foreign Application Priority Data

Oct. 31, 1991 [AT] Austria .................... 2171/91

[51] Int. Cl.6 ............................................. H05K 1/00
[52] U.S. Cl. ................................. 174/262; 174/259; 174/261; 361/778
[58] Field of Search ............... 174/259, 261, 262, 263, 174/266, 267; 361/748, 760, 767, 777, 778, 792; 428/901; 228/180.1

[56] References Cited

U.S. PATENT DOCUMENTS 4,024,629  5/1977  Lemoine et al. .
4,088,828  5/1978  Yamamoto et al. .
4,963,697 10/1990  Peterson et al. .
5,072,075 12/1991  Lee et al. .

Primary Examiner—Leo P. Picard
Assistant Examiner—Cheryl R. Figlin
Attorney, Agent, or Firm—Ernestine C. Bartlett

[57] ABSTRACT

A two-layer or multilayer printed circuit board (1) comprises a support plate (2) carrying a first conductor pattern (3) and a second conductor pattern (21) which is connected to the support plate (2) via an adhesive layer (13) consisting of adhesive material, a solder-stop layer (30) being applied to the second conductor pattern. A hole (14, 15) is formed in the adhesive layer (13), via which hole a solder section (4, 5) of the first conductor pattern (3) can be electrically connected to a solder section (22, 23) of the second conductor pattern (21) via a soldered joint (37, 38), a further hole (31, 32) being formed in the solder-stop layer (30), which hole communicates with the hole (14, 15) in the adhesive layer (13), the cross-sectional area of the further hole being divisible in two areas of equal shape and equal surface content, one of the areas being coincident with the cross-sectional area of the hole (14, 15) in the adhesive layer (13) and the other area being situated completely inside a closed area of the solder section (22, 23) of the second conductor pattern (21).

12 Claims, 3 Drawing Sheets

TWO-LAYER OR MULTILAYER PRINTED CIRCUIT BOARD

FILED OF THE INVENTION

The invention relates to a two-layer or multilayer printed circuit board comprising a support plate and a first conductor pattern having a first solder section and comprising a second conductor pattern having a second solder section, which second conductor pattern is separated from the first conductor pattern by an adhesive layer, the first solder section and the second solder section communicating with one another via a hole in the adhesive layer, the second solder section extending up to the hole and a solder-stop layer having a further hole provided on the second conductor pattern, which further hole communicates with the hole in the adhesive layer and leads to the second and the first solder sections and, in a plan view of the printed circuit board, the cross-sectional area of said further hole having a line of symmetry.

BACKGROUND OF THE INVENTION

A printed circuit board of the type described in the opening paragraph was obtained as a result of research conducted by Applicants. In this printed circuit board each further hole in the solder-stop layer has a round cross-sectional area, the solder section of the second conductor pattern, which is surrounded by such a further hole, exhibiting a ring-shaped cross-sectional area which is commonly referred to as solder land, and the hole in the adhesive layer, which is surrounded by the solder land, and the solder section of the first conductor pattern, which is accessible via this hole for a soldered joint, exhibit a round cross-sectional area, which explains why the latter solder section is commonly referred to as solder pad.

It has been found that due to the difference in shape, round solder sections and ring-shaped solder sections have different soldering properties, for example as regards a uniform distribution of liquid soldering tin exhibiting high surface tensions over all solder sections. Further it has been found that the surface areas of the solder pads and solder lands which can be used for forming soldered joints generally have different dimensions. Besides, further research conducted on such printed circuit boards has revealed that in interconnecting the adhesive layer and the support plate, which is carried out in a pressing process using heat and pressure, the heated and softened adhesive layer is often caused to leak out at the interface between a ring-shaped solder land and the solder pad surrounded by said land, said efflux occurring below the ring-shaped solder land and extending radially towards the solder pad, thereby forming a ring-shaped solder barrier of adhesive material between the solder land and the solder pad, which solder barrier tends to divide the liquid soldering tin; however, due to the high surface tensions of the liquid soldering tin, which counteract such a division, the soldering fin always flows to one side of the solder barrier. Owing to the difference in shape, between the solder lands and the solder pads, which leads to a different soldering behavior, and due to the fact that the dimensions of the surface areas of the solder lands and the solder pads available for forming soldered joint are different, and due to the possible presence of a solder barrier formed by the efflux of adhesive material, relatively often no electrically conductive soldered joints between the solder lands and the solder pads are formed in a soldering process. For example, in a customary industrial wave soldering process, because the still liquid soldering tin is always caused to flow to that one of the two solder sections to be electrically interconnected but exhibiting different shapes and surface areas (and possibly, being separated from each other by a solder barrier, which has the largest surface area) so that the other solder section is only wetted with soldering tin, thereby forming a soldering fin film which is so thin that due to the presence of a solder barrier or a small difference in level between the solder sections to be interconnected, no electrical soldered joint is obtained between the solder sections, i.e. the solder lands and the solder pads. Soldered joints of such poor quality are of course undesirable and disadvantageous because either the printed circuit board must be rejected when the defective soldered joints cannot be traced or the printed circuit board must be subsequently repaired by further soldering processes, which is time-consuming and involves additional costs.

SUMMARY OF THE INVENTION

An object of the invention is to obviate the above drawbacks and improve a printed circuit board of the type described in the opening paragraph in such a manner that in a soldering process a perfect soldered joint between a solder section of the first conductor pattern and a solder section of the second conductor pattern is always obtained via a hole in the adhesive layer. For this purpose, the invention is characterized in that in a plan view of the printed circuit board, the further hole in the solder-stop layer is positioned such that the hole in the adhesive layer has a boundary line which is coincident with the line of symmetry, and in that the hole in the adhesive layer is coincident with one half of said further hole, which half is bounded by the line of symmetry, the first and the second solder section having equally shaped and equally dimensioned surface areas.

In this manner, it is achieved in a readily conceivable way that the solder sections of the first and the second conductor pattern, which are to be interconnected electrically, have surface areas for forming a soldered joint which are substantially equally large, and that said solder sections have substantially the same shape and, hence, the same soldering behavior, so that a perfect soldered joint between a solder section of the first conductor pattern and a solder section of the second conductor pattern can be attained via a hole in the adhesive layer.

Such a perfect soldered joint can also be attained when a solder barrier, formed between the two solder sections as a result of the efflux of adhesive material of the adhesive layer, extends along the line of symmetry through the cross-sectional area of the further hole in the solder-stop layer because, unlike the printed circuit board according to the prior art in which the soldering tin was divided in soldering tin areas of different size and shape, so that as a result of the high surface tension all soldering tin flows into the solder section having the largest area, in a soldering process in accordance with the invention, the solder barrier divides the still liquid soldering tin into equally large and equally shaped soldering tin areas. Since, in the printed circuit board in accordance with the invention, the liquid soldering tin can be divided in a soldering process in two equally large and equally shaped soldering tin areas, it is achieved that the liquid soldering tin remains uniformly distributed over the two solder sections to be soldered to one another. Additionally, also as a result thereof, in the cooling process at the end of the soldering process the uniformly distributed soldering tin acts with equal intensity in the direction of the possibly present solder barrier, so that during hardening of the soldering tin a perfect soldering-tin joint is obtained over the solder barrier. A further advantage is that in the printed circuit board in accordance with the invention, the soldered joints between the solder sections can be checked visually in a simple and adequate manner because it only consists in checking whether a soldered joint extends along the line of symmetry through the cross-sectional area of a further hole in the solder-stop layer.

The line of symmetry through the cross-sectional area of a further hole may be S-shaped. Advantageously, the line of symmetry is a straight line and, in a plan view of the printed circuit board, the hole in the adhesive layer has a straight boundary line which is substantially coincident with said straight line of symmetry. This is advantageous with a view to forming the hole in the adhesive layer in the simplest way possible.

The hole in the adhesive layer may have, for example, a square, rectangular or triangular cross-sectional area, the further hole in the solder-stop layer then correspondingly having a rectangular, square or rhomboidal cross-sectional area. Advantageously, the further hole in the solder-stop layer has a round cross-sectional area and the hole in the adhesive layer has a semi-circular cross-sectional area. Such an embodiment was found to be very advantageous for achieving the most uniform distribution of the liquid soldering tin used to form a soldered joint.

It has been found to be very advantageous if, in a plan view of the printed circuit board, a through-hole is provided through which passes the line of symmetry which extends through the cross-sectional area of the further hole in the solder-stop layer, which through-hole passes through the solder section of the second conductor pattern, the adhesive layer, the solder section of the first conductor pattern and the support plate. In such a construction there can be no leaked-out adhesive material at the area of the through-hole extending through the solder section of the second conductor pattern, the adhesive layer, the solder section of the first conductor pattern and the support plate, and which, consequently, could not be formed until after the pressing process in which the adhesive layer was bonded to the support plate, so that in this area there can be no solder barrier and, hence, a perfect soldered joint between the two solder sections of the first conductor pattern and the second conductor pattern is formed.

In this connection, it has further been found to be very advantageous if said hole is mirror symmetrical relative to a straight line of symmetry through the cross-sectional area of the further hole in the solder-stop layer. This is advantageous for providing the through-hole in the most unproblematic and simple way and, in particular, for obtaining a maximum correspondence in shape and surface area between the solder sections of the first and the second conductor patterns, which are to be interconnected.

Further, it has been found to be very advantageous if, unlike the area of the solder section of the, first conductor pattern which is covered by the adhesive layer, the area of the solder section of the first conductor pattern which is surrounded by the hole is at least partially arched in the direction of the second conductor pattern, the hole in the adhesive layer leading to the solder section of the first conductor pattern. In this manner it is attained that the solder sections of the first and the second conductor pattern which are to be connected through a soldered joint extend at least substantially in the same plane, which with a view to forming a perfect soldered joint between said two solder sections is extremely advantageous because both solder sections can be reached equally easily by the still liquid soldering tin.

BRIEF DESCRIPTION OF THE DRAWINGS

The invention will be explained in greater detail by means of four exemplary embodiments and with reference to the accompanying drawings, which, however, shall not be interpreted as limiting the scope of the invention.

DETAILED DESCRIPTION OF THE PREFERRED EMBODIMENTS

Figure 8:
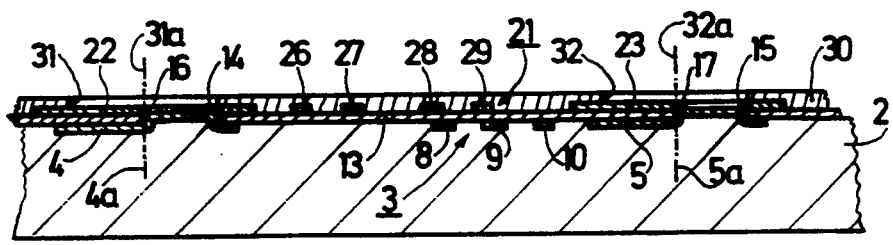
FIG. 8 is a cross-sectional view of a pan of a further intermediate product obtained from the intermediate product of FIG. 7, which further intermediate product is provided with a solder-stop-lacquer layer on the side provided with the second conductor pattern, further, circular, holes which communicate with the semi-circular holes in the laminate being formed in the solder-stop-lacquer layer.
Figure 9:
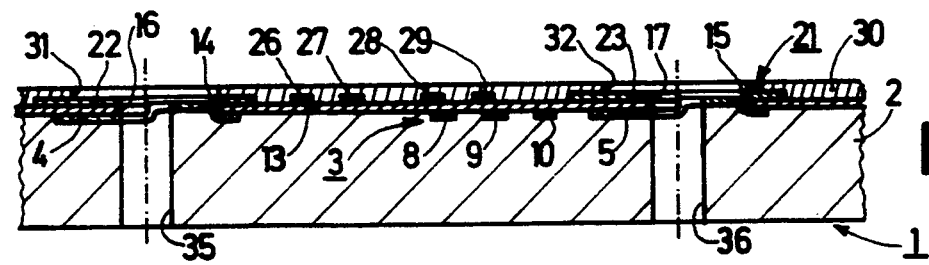
FIG. 9 is a cross-sectional view of a part of a two-layer printed circuit board not provided with components obtained from the intermediate product in accordance with FIG. 8, in which printed circuit board a through-hole is formed in the support plate at the area of each of the holes or further holes.
Figure 10:
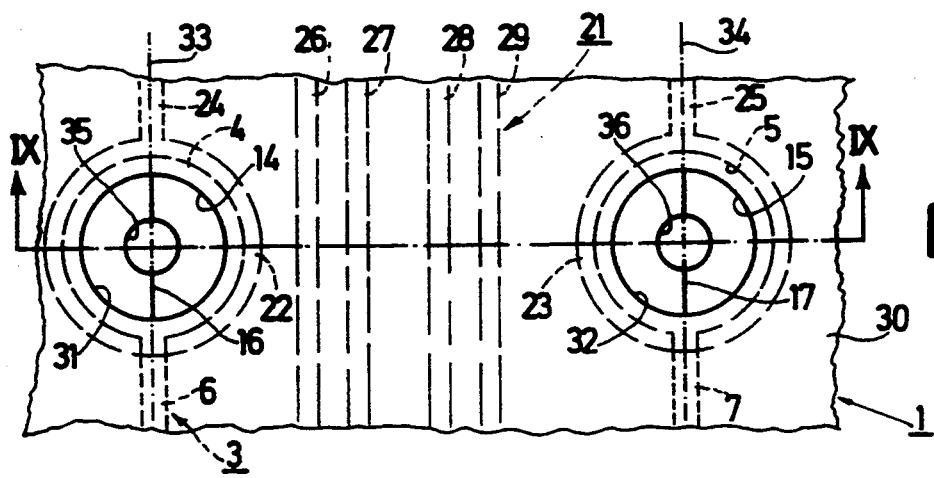
FIG. 10 is a top view of the part of the printed circuit board not provided with components in accordance with FIG. 9.
Figure 11:
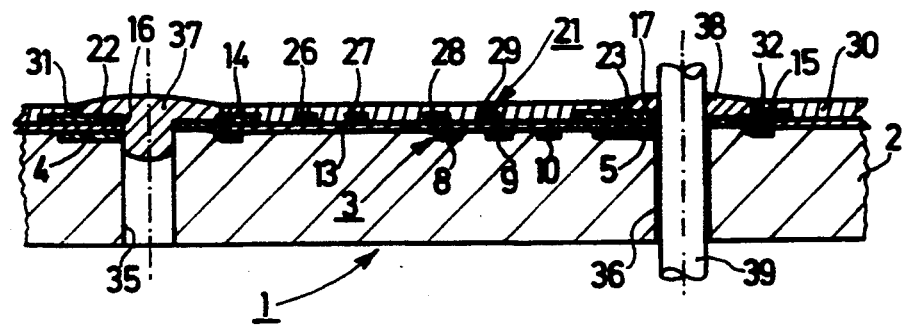
FIG. 11 is a cross-sectional view of a part of a loaded, finished, i.e. mounted with components, two-layer printed circuit board in which soldered joints are formed in the holes or further holes.

The illustrations of FIGS. 1 to 14 are shown at approximately ten magnifications, however, for clarity, the layer thicknesses are depicted at even higher magnifications. FIGS. 9, 10 and 11 show a part of an inventive two-layer printed circuit board 1, FIGS. 9 and 10 depicting the printed circuit board in the state without components and FIG. 11 depicting said printed circuit board in the soldered and finished state, i.e. mounted with components. Below, the individual process steps in the manufacture of the printed circuit board 1 in accordance with FIGS. 9 to 11 are described with reference to FIGS. 1 to 11.

Figure 1:
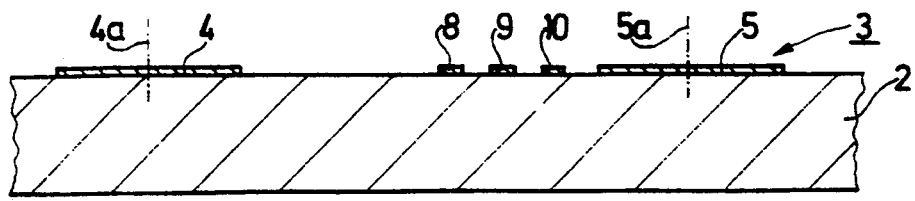
FIG. 1 is a cross-sectional view of a part of a support plate which is provided with a first conductor pattern.

FIG. 1 shows a part of a support plate 2 for the two-layer printed circuit board 1 which is partly shown in its finished state in FIG. 11. The support plate 2 which has a thickness of approximately 1.6 mm consists predominantly of a starting material in the form of a laminate of resin-impregnated paper layers. This laminate is provided on its upper side with an adhesive layer, not shown in any of the Figures, which serves to bond a continuous copper foil to the laminate forming the support plate 2. By means of a so-called subtractive process, such as a photo-etching method, a first conductor pattern 3 can be forged from said 35 $\mu$m thick copper foil, in known manner. The formation of the first conductor pattern 3 on a support plate 2 which does not carry a copper foil can alternatively be carried out by means of, for example, a so-called additive process, such as a screen printing process. FIG. 1 shows a first conductor pattern 3 comprising two round solder pads 4 and 5 having two conductor tracks 6 and 7 extending away from said solder pads, as shown in FIG. 10, and three further conductor tracks 8, 9 and 10.

Figure 2:
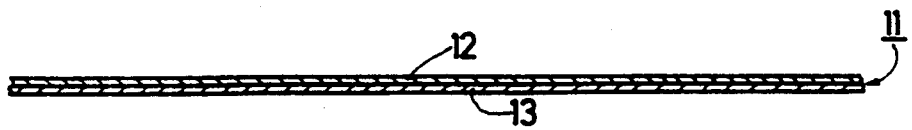
FIG. 2 is a cross-sectional view of a part of a laminate consisting of a copper layer and an adhesive layer, which laminate is used in the manufacture of the inventive two-layer printed circuit board.

FIG. 2 shows a pan of a laminate 11 consisting of a copper layer 12 and an adhesive layer 13. Said copper layer 12 consists of a copper foil having a thickness of 3 $\mu$m. A laminate is to be understood to mean herein a product consisting of at least two layers which are bonded together, not necessarily in a laminating process, but alternatively by, for example, applying an adhesive to the conductive layer. A 40 $\mu$m thick adhesive layer 13 is applied to the bottom side of the copper foil 12. The thickness of said adhesive layer may alternatively range between 10 $\mu$m and 70$\mu$m. Said adhesive layer 13 consists of an adhesive material having a hardness, in a specific temperature range, which is higher than the hardness of at least the area of the support plate 2, shown in FIG. 1, adjoining the first conductor pattern, to which support plate the adhesive layer 13 must be attached in a pressing process using heat and pressure. In the present case, the adhesive material of the adhesive layer 13 consists of an acrylate adhesive whose degree of polymerization is selected to be such that it exhibits the highest possible glass transition temperature or softening temperature, i.e. it is relatively hard at low temperatures.

Figure 3:
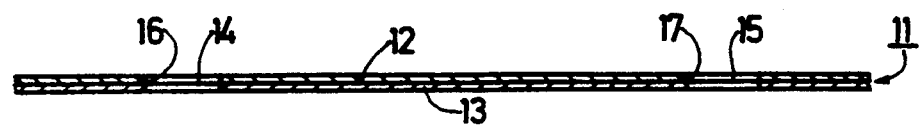
FIG. 3 is a cross-sectional view of a part of the laminate of FIG. 2, semicircular holes extending through the copper layer and the adhesive layer being formed in the laminate.
Figure 4:
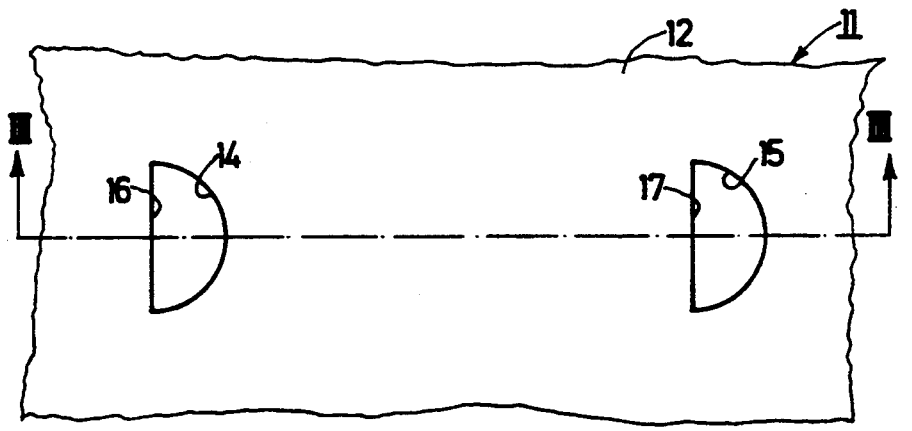
FIG. 4 is a top view of the part of the laminate shown in FIG. 3.

In the manufacture of the printed circuit board 1 in accordance with FIGS. 9 to 11, the laminate H in accordance with FIG. 2 is provided with holes 14 and 15 which are provided in a simple manner in a punching process. In this case, the holes 14 and 15 have a semi-circular cross-sectional area and pass through the copper layer 12 and the adhesive layer 13. The holes 14 and 15 are positioned such that, in a plan view of the support plate 2, the centers 4a and 5a of the solder pads 4 and 5 pass through the straight boundary lines 16 and 17 of the holes 14 and 15. A pan of the laminate 11 having holes 14 and 15 is shown in FIGS. 3 and 4. As shown in FIGS. 1, 3 and 4, the radius of the semi-circular holes 14 and 15 is selected so as to be slightly smaller than the radius of the solder pads 4 and 5.

Figure 5:
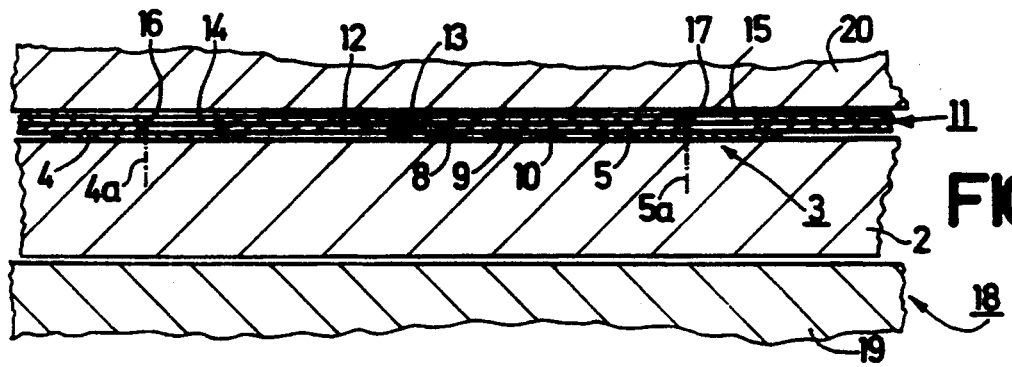
FIG. 5 is a cross-sectional view of the part of the support plate provided with the first conductor pattern in accordance with FIG. 1 and the pan of the laminate having semi-circular holes, in accordance with FIG. 3, provided on the support plate on the side of the first conductor pattern, said conductor pattern and laminate being arranged on top of each other in a press which is diagrammatically represented by a platen and a ram.

Subsequently, in the manufacture of the printed circuit board 1 in accordance with FIGS. 9 to 11, the laminate 11, in accordance with FIG. 3, having holes 14 and 15 is provided in such a manner on the upper side of the support plate 2, in accordance with FIG. 1, carrying the first conductor pattern 3, that the centers 4a and 5a of the solder pads 4 and 5 pass through the straight boundary lines 16 and 17 of the holes 14 and 15, as shown in FIG. 5. The stack consisting of the support plate 2, the first conductor pattern 3 and the laminate 11 is placed in a press 18, which is diagrammatically represented by a platen 19 and a ram 20. In said press 18, the support plate 2 and the laminate 11 are accurately positioned with respect to one another in such a manner that the cross-sectional areas of the holes 14 and 15 are located completely inside the closed solder pads 4 and 5. In practice, paper layers are inserted between the platen 19 and the bottom side of the support plate 2 and between the ram 20 and the upper side of the copper foil 12, however, said paper layers which serve to eliminate irregularities and which ensure that both the platen 19 and the ram 20 act sufficiently on the areas of the printed circuit board cooperating with said press members are not shown in FIG. 5 for reasons of simplicity. Subsequently, the ram 20 and the platen 19 are moved towards each other and heated to attach the adhesive layer 13 to the support plate 2 in a pressing process using heat and pressure.

In the pressing process, the parts of the printed circuit board located between the platen 19 and the ram 20 are subjected to a maximum pressure of approximately 100 bar, and, as described above, both the platen 19 and the ram 20 are heated until a maximum working temperature of approximately 150° C. is attained. Said heating process also causes the support plate 2, its adhesive layer (not shown) and the copper layer 12 and the adhesive layer 13 connected thereto to be heated. The adhesive layer 13 consists of an adhesive material which, in a specific temperature range, exhibits a higher hardness than the area of support plate 2 adjoining the first conductor pattern 3, consequently in the pressing process the area of the first conductor pattern 3 covered by the adhesive layer 13 is pressed into the support plate 2 by the adhesive layer 13 whose hardness exceeds that of the area of the support plate 2 adjoining the first conductor pattern 3 during a specific length of time in the pressing process, so that in the finished printed circuit board 1 in accordance with FIG. 11 the area of the first conductor pattern 3 covered by the adhesive layer 13 is completely pressed into the support plate 2 as a result of the pressing process of the adhesive layer 13. Said pressing-in only takes place at those locations where the first conductor pattern 3 is covered by the adhesive layer 13. Consequently, in those regions where there is no adhesive layer 13, i.e. at the location of the holes 14 and 15, the first conductor pattern 3 is not pressed into the support plate 2, which is the reason why only the outer semi-annular sections of the solder pads 4 and 5 covered by the adhesive layer 13 are pressed into the support plate 2, while the centrally located semi-circular sections are raised relative to said semi-annular sections. In the pressing process, and as a result of the high pressure generated and the consequent substantial heating of both the support plate 2 and the adhesive layer 13, and due to the holes 14 and 15 which are exempt therefrom and the resulting difference in pressure rails between the support plate 2 and the area of the holes 14 and 15 in the laminate 11 on the one hand and the remaining area of the laminate 11. on the other hand, the areas of the support plate 2 which are located below the central semi-circular sections of the solder pads 4 and 5 are raised relative to the other areas of the support plate 2, causing the central semi-circular sections of the solder pads 4 and 5 to be raised or arched so as to be practically coplanar with the copper foil 12. In the present case, the arched solder pads 4 and 5 are predominantly dish-shaped; however, they may alternatively be dome-shaped. After attaining the desired working temperature of approximately 150° C., said temperature is maintained for a specific length of time, after which the platen 19 and the ram 20 are cooled, without reducing the pressure, to avoid rejection of the printed circuit board intermediate product. In the pressing process an adhesive bond is formed between the adhesive layer 13 and the support plate 2.

Figure 6:
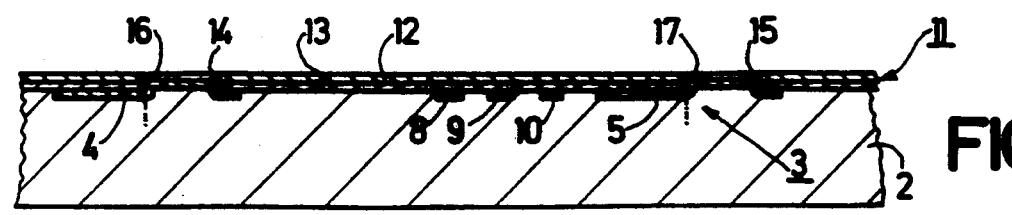
FIG. 6 is a cross-sectional view of a pan of an intermediate product obtained after a pressing process in said press, the laminate having semi-circular holes being secured to the support plate.

The intermediate product resulting from the pressing process is partly shown in FIG. 6. As shown in FIG. 6, the area of the first conductor pattern 3 which is covered by adhesive layer 13 is completely pressed into the support plate 2 in the pressing process. The other areas of said first conductor pattern 3, i.e. the uncovered areas of the solder pads 4 and 5, are arched in the direction of the copper foil 12. As FIG. 6 further shows, the semi-circular holes 14 and 15 lead to the arched areas of the solder pads 4 and 5 which form solder sections of the first conductor pattern 3. In a plan view of the printed circuit board, the cross-sectional areas of the semi-circular holes 14 and 15 are located completely inside the closed areas of the solder pads 4 and 5, as shown in FIG. 6 and, in particular, in FIG. 10.

Figure 7:
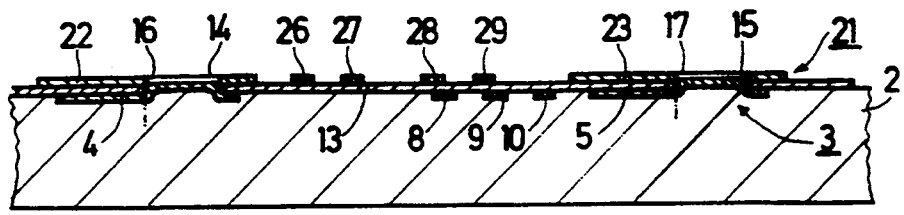
FIG. 7 is a cross-sectional view of a further intermediate product obtained from the intermediate product of FIG. 6, which further intermediate product comprises a second conductor pattern manufactured from the copper layer of the laminate.

As shown in FIG. 7, in the further manufacturing process of the printed circuit board 1 in accordance with FIGS. 9 and 11, a second conductor pattern 21 is formed from the copper layer 12, for example, also by means of a photo-etching process. FIG. 7 shows two solder lands 22 and 23 of said second conductor pattern 21 and conductor tracks 24 and 25 extending away from said solder lands, as shown in FIG. 10, as well as four further conductor tracks 26, 27, 28 and 29. In this case, the solder lands 22 and 23 have circular boundary lines and are provided on the inside with a semi-circular area formed by the holes 14 and 15. The circular boundary lines of the solder lands 22 and 23 are located concentrically with respect to the solder pads 4 and 5, the outside diameter of the solder lands 22 and 23 being selected so as to be larger than the outside diameter of the solder pads 4 and 5. The solder lands 22 and 23 extend up to the holes 14 and 15 and surround them completely. The solder lands 22 and 23 form solder sections of the second conductor pattern 21.

It is noted that an intermediate product similar to that shown in part in FIG. 7 can also be obtained in a different manner, i.e. in that in addition to forming holes in a laminate having a synthetic resin intermediate layer between the copper layer and the adhesive layer, the copper layer of said laminate is also used to form the second conductor pattern, after which the layer construction, carrying the second conductor pattern, and comprising the synthetic resin intermediate layer and the adhesive layer is connected to the support plate 2 in a pressing process.

Subsequently, in the manufacture of the printed circuit board 1 in accordance with FIGS. 9 to 11, the intermediate product partly shown in FIG. 7 is provided on the side of the second conductor pattern 21 with a solder-stop-lacquer layer 30 by means of a customary technique. A part of the intermediate product comprising a solder-stop-lacquer layer 30 is shown in FIG. 8. As shown in said Figure, the solder-stop-lacquer layer 30 is provided with further holes 31 and 32 which communicate with the holes 14 and 15, respectively. In a plan view of the printed circuit board, said further holes 31 and 32 have cross-sectional areas which, in this case, are circular. Thus, the further holes 31 and 32 have a cross-sectional area which, in a plan view of the printed circuit board, can be divided in two mirror-symmetrical areas of equal shape and equal surface area with respect to a straight parting line, i.e. a line of symmetry 33 and 34. The centers 31a and 32a of the further holes 31 and 32 in the solder-stop-lacquer layer 30 coincide with the centers 4a and 5a of the solder pads 4 and 5 and with the centers of the solder lands 22 and 23, as shown in FIG. 8. The radius of the further holes 31 and 32 in the solder-stop-lacquer layer 30 is selected so as to be substantially equal to the radius of the semi-circular holes 14 and 15 in the adhesive layer 13 and in the solder lands 22 and 23. Within the cross-sectional areas of the further holes 31 and 32 in the solder-stop-lacquer layer 30 there are situated the cross-sectional areas of the holes 14 and 15 in the adhesive layer 13 and in the solder lands 22 and 23 as well as at least a pan of the closed area of the solder lands 22 and 23 of the second conductor pattern 21.

As shown in FIG. 8 and, in particular, in FIG. 10, the cross-sectional area of each hole 14 and 15 in the adhesive layer 13 is coincident with one of the two mirror-symmetrical areas of the cross-sectional area of each further hole 31 and 32 in the solder-stop-lacquer layer 30, which areas adjoin the line of symmetry 33 and 34. Further, the other one of the two mirror-symmetrical areas of the cross-sectional area of each further hole 31 and 32 in the solder-stop-lacquer layer 30, which mirror-symmetrical areas adjoin the line of symmetry 33 and 34, are completely situated inside the closed area of each solder land 22 and 23 of the second conductor pattern 21. As mentioned above, each further hole 31 and 32 in the solder-stop-lacquer layer 30 has a circular cross-sectional area and each hole 14 and 15 in the adhesive layer 13 has a semi-circular cross-sectional area.

The intermediate product to which the solder-stop-lacquer layer 30 is applied is coated, on the side of the solder-stop-lacquer layer 30, with a protective lacquer, not shown in FIG. 8, which has the property that the heat generated in a subsequent soldering process causes said protective lacquer to become liquid and act as a fluxing agent. Said protective lacquer layer protects the copper regions which would be exposed in a subsequent soldering process, such as the solder lands 22 and 23 and the solder pads 4 and 5, from oxidation.

Subsequently, as shown in FIG. 9, through-holes 35 and 36 which pass through the solder lands 22 and 23, the adhesive layer 13, the solder pads 4 and 5 and the support plate 2 are formed in a simple and inexpensive manner by punching or alternatively by boring. Said through-holes 35 and 36 serve as degasing holes allowing any gases formed in a subsequent soldering process due to heating, which is very likely due to the presence of adhesive material, to escape through the support plate 2. In addition, said through-holes can also be used to insert the leads of components.

Next, the printed circuit board 1 shown, in part, in FIGS. 9 and 10 is provided with components, customary components having leads being mounted on the bottom side (FIG. 9) of the printed circuit board 1, and the leads being passed through the holes 36 formed for this purpose, and the free ends of the leads terminating beyond the upper side (FIG. 9) of the printed circuit board 1. So-called SMD components (not shown) are mounted directly on the upper side (FIG. 9) of the printed circuit board 1 shown in FIGS. 9 and 10.

Subsequently, a desired soldered joint is formed between on the one hand solder lands 22, 23 and on the other hand solder pads 4, 5, respectively. Said joints are formed by means of wave soldering after the above-mentioned loading operation has been carried out. This has the advantage that the desired soldered joints between the solder pads and the solder lands of the two conductor paRems can be formed, without taking additional measures, in the soldering process which is necessary any way to solder the component leads to the associated printed circuit terminals.

FIG. 11 shows a part of the finished, printed circuit board 1 mounted with components obtained after a wave-soldering operation as mentioned above. In said printed circuit board 1, the solder lands 22, 23 and the solder pads 4, 5, respectively, are interconnected by a soldered joint 37 and 38, respectively, of soldering tin, said soldered joint 38 additionally establishing an electrical connection between a component lead 39 of a component which is not shown and the solder land 23 and the solder pad 5.

In the case of the printed circuit board shown in FIG. 11, the soldered joints electrically contact equally shaped and equally large areas of the solder lands and solder pads which are interconnected by said soldered joints. By virtue of the fact that the shape and the surface area of the solder areas interconnected by said soldered joints are substantially equal and extend in substantially the same plane, it has been obtained in a simple manner that said solder areas exhibit a substantially equal solder behavior and that, consequently, perfect soldered joints are attained. The formation of said perfect soldered joints is further supported by the holes formed, after the pressing operation, to connect the adhesive layer to the support plate, because, even when an efflux of adhesive during the pressing operation leads to the formation of a solder barrier along the parting line through the further holes in the solder-stop-lacquer layer, said holes, which are provided after the pressing operation, make sure that this solder barrier is removed at the location of the holes, so that at said location soldered joints are obtained which are not obstructed by a solder barrier.

Figure 12:
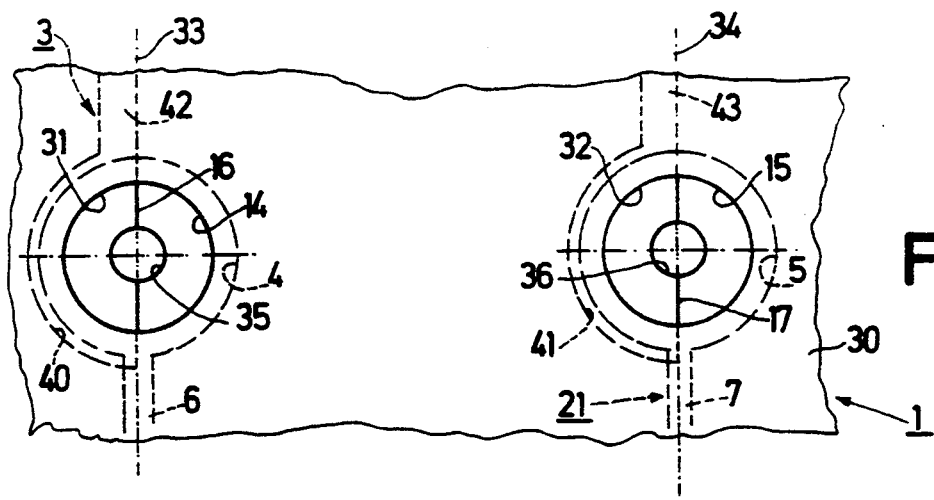
FIG. 12 shows, in the same manner as FIG. 10, a part of a printed circuit board not provided with components in accordance with a second embodiment of the invention.

The difference between the printed circuit board not provided with components shown in FIG. 12 and the printed circuit board in accordance with the above-described exemplary embodiment consists in that, instead of solder lands, semi-circular solder pads 40 and 41 are formed in the second conductor pattern 21. Conductors 42 and 43 extend away from said solder pads 40 and 41, respectively.

Figure 13:
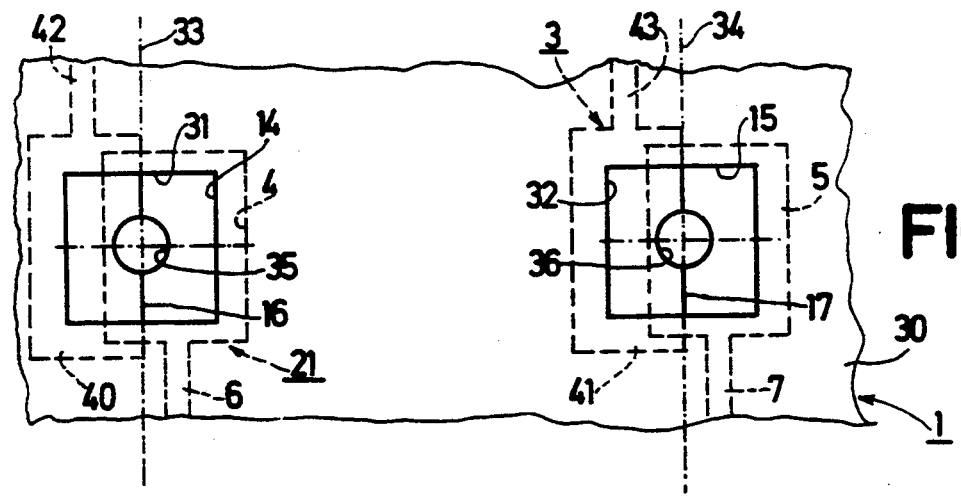
FIG. 13 shows, in the same manner as FIGS. 10 and 12, a part of a printed circuit board not provided with components in accordance with a third exemplary embodiment of the invention.

In the printed circuit board not provided with components in accordance with FIG. 13, the further holes 31 and 32 in the solder-stop-lacquer layer 30 are square. The solder pads 4 and 5 of the first conductor pattern 3 are rectangular. In order to establish a soldered joint with the rectangular solder pads 4 and 5 of the first conductor pattern 21, the second conductor pattern 21 also has rectangular solder pads 40 and 41.

Figure 14:
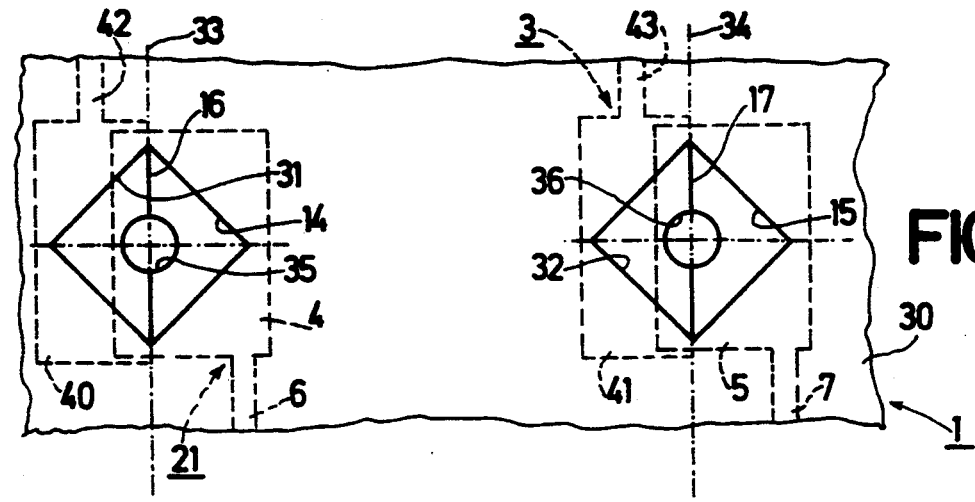
FIG. 14 shows, in the same manner as FIGS. 10, 12 and 13, a part of a printed circuit board not provided with components in accordance with a fourth exemplary embodiment of the invention.

In the printed circuit board not provided with components in accordance with FIG. 14, the further holes 31 and 32 in the solder-stop-lacquer layer 30 are rotated through 45° with respect to the position of said further holes in the printed circuit board not provided with components in accordance with FIG. 13.

In the above-described exemplary embodiments an unsupported laminate is used for the manufacture of the printed circuit board, said laminate only consisting of a copper foil and an adhesive layer applied to said copper foil. However, it is alternatively possible to use a laminate having a synthetic resin support layer, in which case the synthetic resin support layer is provided on one side with a copper layer and on the other side with an adhesive layer. Such a laminate has the advantage that it has a greater strength, which is sometimes desirable and advantageous. It is alternatively possible to use another support plate whose construction differs from that of the exemplary embodiments described hereinbefore. In the above-described exemplary embodiments, only one side of the support plate is provided with a first conductor pattern, and a second conductor pattern is provided thereon. The second side of the support plate may be provided with a third conductor pattern whose solder sections are connected to solder sections of a fourth conductor pattern which is connected to the support plate by a further adhesive layer on the side of the third conductor pattern.

We claim:

1. A two-layer or multilayer printed circuit board comprising a support plate carrying on a surface thereof a first conductor pattern having a first solder section, and a second conductor pattern having a second solder section, which second conductor pattern is separated from the first conductor pattern by an adhesive layer, the first solder section and the second solder section connecting with one another via a hole in the adhesive layer, the second solder section extending up to the hole and a solder-stop layer having a further hole being provided on the second conductor pattern, which further hole connects with the hole in the adhesive layer and leads to the second and the first solder sections and, in a plan view of the printed circuit board, the cross-sectional area of said further hole having a line of symmetry, characterized in that, in a plan view of the printed circuit board, said further hole in the solder-stop layer is positioned such that the hole in the adhesive layer has a boundary line which is coincident with the line of symmetry, and in that the hole in the adhesive layer is coincident with one half of said further hole, which half is bounded by the line of symmetry, the first and second solder sections having equally shaped and equally dimensioned surface areas.

2. A printed circuit board as claimed in claim 1, characterized in that the line of symmetry is formed by a straight line and in that, in a plan view of the printed circuit board, the hole in the adhesive layer has a straight boundary line which is substantially coincident with said straight line of symmetry.

3. A printed circuit board as claimed in claim 2, characterized in that the further hole in the solder-stop layer has a round cross-sectional area and in that the hole in the adhesive layer has a semi-circular cross-sectional area.

4. A printed circuit board as claimed in claim 1, characterized in that, in a plan view of the printed circuit board, a through-hole is provided through which passes the line of symmetry which extends through the cross-sectional area of the further hole in the solder-stop layer, and in that said through-hole passes through the solder section of the second conductor pattern, the adhesive layer, the solder section of the first conductor pattern and the support plate.

5. A printed circuit board as claimed in claim 4, characterized in that the through-hole is mirror symmetrical relative to a straight line of symmetry through the cross-sectional area of the further hole in the solder-stop layer.

6. A printed circuit board as claimed in claim 1 characterized in that the area of the solder section of the first conductor pattern which is surrounded by the hole is at least partially arched in the direction of the second conductor pattern, the hole in the adhesive layer leading to the solder section of the first conductor pattern.

7. A printed circuit board as claimed in claim 2 wherein in a plan view of the printed circuit board, a through-hole is provided through which passes the line of symmetry which extends through the cross-sectional area of the further hole in the solder-stop layer, and said through-hole passes through the solder section of the second conductor pattern, the adhesive layer, the solder section of the first conductor pattern and the support plate.

8. A printed circuit board as claimed in claim 3 wherein in a plan view of the printed circuit board, a through-hole is provided through which passes the line of symmetry which extends through the cross-sectional area of the further hole in the solder-stop layer, and said through-hole passes through the solder section of the second conductor pattern, the adhesive layer, the solder section of the first conductor pattern and the support plate.

9. A printed circuit board as claimed in claim 2 wherein the area of the solder section of the first conductor pattern which is surrounded by the hole is at least partially arched in the direction of the second conductor pattern, the hole in the adhesive layer leading to the solder section of the first conductor pattern.

10. A printed circuit board as claimed in claim 3 wherein the area of the solder section of the first conductor pattern which is surrounded by the hole is at least partially arched in the direction of the second conductor pattern, the hole in the adhesive layer leading to the solder section of the first conductor pattern.

11. A printed circuit board as claimed in claim 4 wherein the area of the solder section of the first conductor pattern which is surrounded by the hole is at least partially arched in the direction of the second conductor pattern, the hole in the adhesive layer leading to the solder section of the first conductor pattern.

12. A printed circuit board as claimed in claim 5 wherein the area of the solder section of the first conductor pattern which is surrounded by the hole is at least partially arched in the direction of the second conductor pattern, the hole in the adhesive layer leading to the solder section of the first conductor pattern.

* * * * *